United States Patent [19]

Yokosuka

[11] Patent Number: 5,151,336
[45] Date of Patent: Sep. 29, 1992

[54] MASKING MATERIAL

[75] Inventor: Toshie Yokosuka, Yono, Japan

[73] Assignee: Kimoto Co., Ltd., Japan

[21] Appl. No.: 579,973

[22] Filed: Sep. 10, 1990

[30] Foreign Application Priority Data

Sep. 14, 1989 [JP] Japan .................................. 1-238557

[51] Int. Cl.$^5$ .............................................. G03F 9/00
[52] U.S. Cl. ........................................... 430/7; 430/5;
430/507; 430/510; 430/358; 430/359; 355/35;
355/80; 252/582; 359/885
[58] Field of Search ............... 430/369, 396, 301, 302,
430/507, 510, 7, 359, 358; 355/80, 35; 252/582;
350/316; 359/890, 885

[56] References Cited

U.S. PATENT DOCUMENTS

| 3,887,485 | 6/1975 | Neuroth | 252/582 |
| 4,793,692 | 12/1988 | Kamio et al. | 252/582 |
| 4,935,166 | 6/1990 | Lee et al. | 252/582 |
| 4,937,177 | 6/1990 | Hubert | 430/369 |

FOREIGN PATENT DOCUMENTS 0143758 7/1986 Japan .
0314553 12/1988 Japan .

Primary Examiner—Charles L. Bowers, Jr.
Assistant Examiner—Thomas R. Neville
Attorney, Agent, or Firm—Lorusso & Loud

[57] ABSTRACT

A masking material with a semiopaque layer containing a coloring agent, characterized in that the semiopaque layer permits the transmission of the light at a wavelength corresponding to the "green-lack" wavelength of color paper.

4 Claims, 5 Drawing Sheets

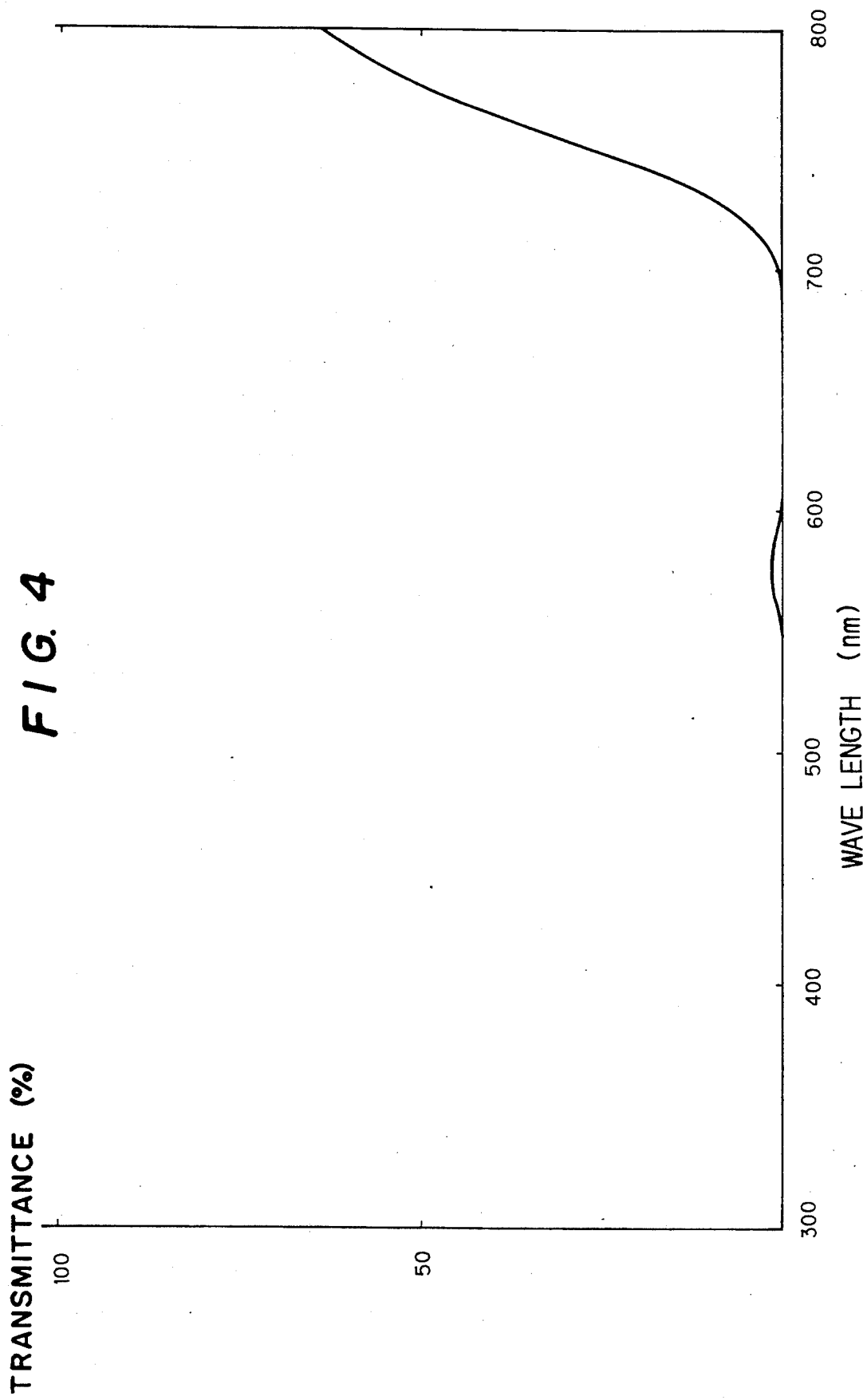

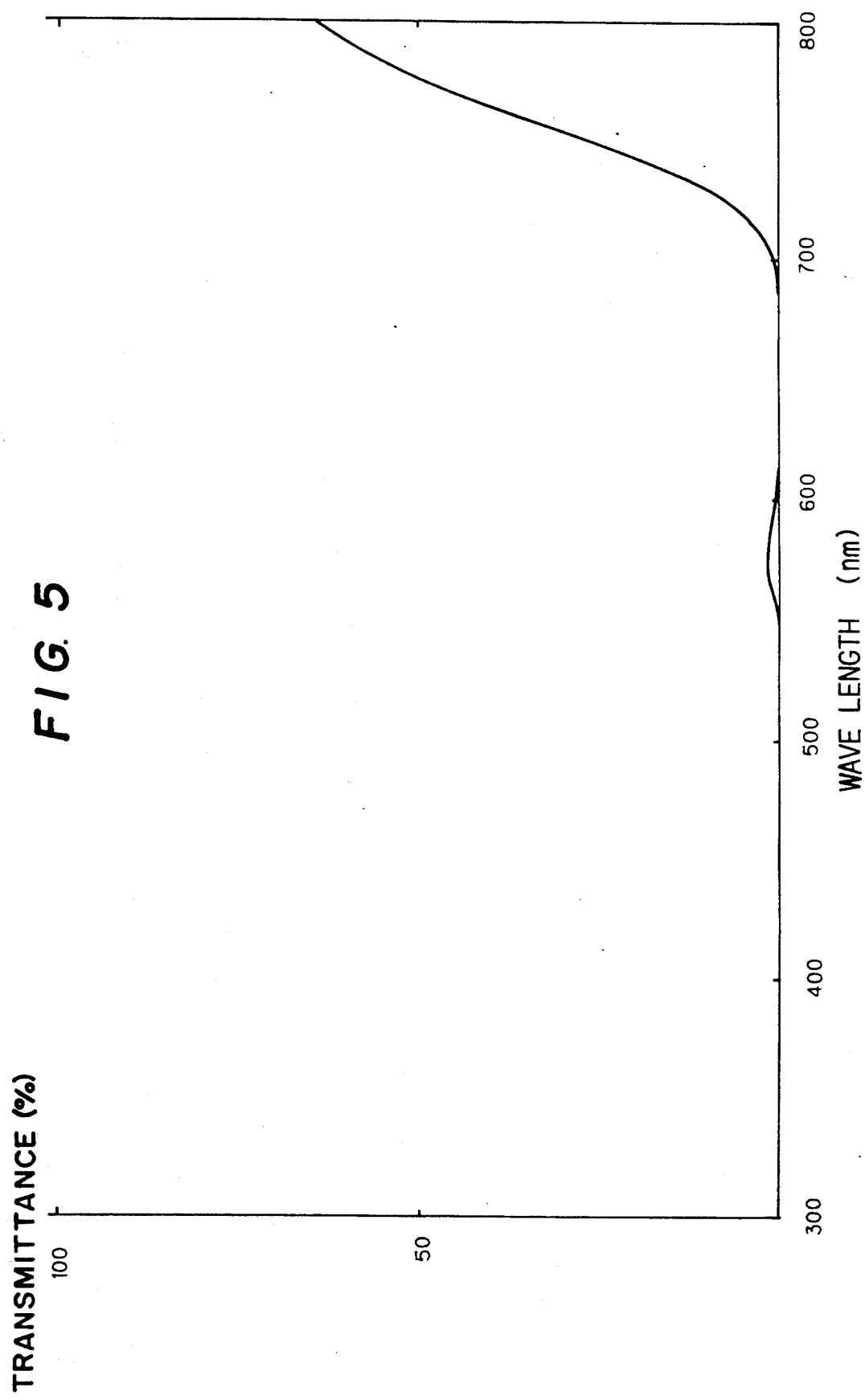

MASKING MATERIAL

BACKGROUND OF THE INVENTION

1. Field of the Invention

The present invention relates to a masking material to be used in the photomechanical process when a proof is made on a color paper and similar materials, with unnecessary parts masked.

2. Description of the Prior Art

Conventional masking materials used in the photomechanical process are mostly applicable only to orthochromatic materials which are sensitive to the regions of the spectrum up to about 580 nm. (See Japanese Patent Laid-open Nos. 143758/1986 and 314553/1988 and Japanese Patent Publication No. 46011/1983). Although there are a few kinds of masking materials that can be applied to photosensitive materials having a broader range of spectrum than orthochromatic materials, they are extremely hard to work with.

At present, the masking of color papers and similar materials (which are sensitive to all the wavelength of visible light) is achieved by using a thick masking material having an extremely low transmittance or by using two or more kinds of masking materials which are different in the wavelength of light they transmit. The former case has a disadvantage that the masking material with an extremely low transmittance makes the underlying original nearly invisible even though a light table is used, and the thick masking material is difficult to cut. The latter case also has a disadvantage that it is very difficult to cut exactly and neatly two or more masking materials placed one over another.

It is common practice in the photomechanical process to make proofs on color paper, and the masking material for this purpose should permit easy cutting on a light table, with the underlying original clearly visible, and yet shut out the light to which color paper is sensitive. However, none of the conventional masking materials meet these requirements.

SUMMARY OF THE INVENTION

The present invention was completed to overcome the above-mentioned disadvantages. Accordingly, it is an object of the present invention to provide a masking material which permits easy cutting on a light table, with the underlying original clearly visible, and shuts out the light to which panchromatic color paper is sensitive.

The gist of the present invention resides in a masking material with a semiopaque layer containing a coloring agent, characterized in that the semiopaque layer permits the transmission of the light at a wavelength corresponding to the "green-lack" wavelength of color paper.

BRIEF DESCRIPTION OF THE DRAWINGS

FIGS. 3 to 5 are charts showing the light transmission spectrum of the masking materials obtained in the examples (These charts are measured by Spectrophotometer model UV240 of Shimadzu Co.).

DESCRIPTION OF THE PREFERRED EMBODIMENTS

Figure 1:
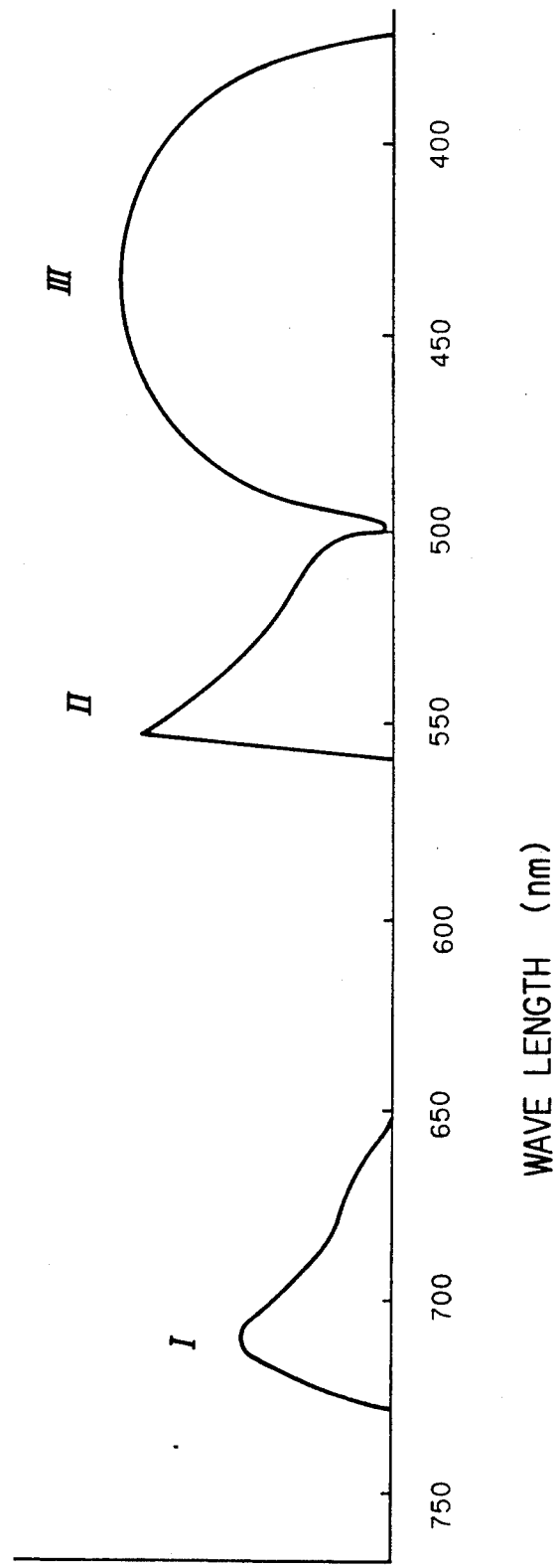
FIG. 1 is a graph showing the spectral relative sensitivity of ordinary color paper.

Color paper usually has three sensitive layers, a red sensitive emulsion layer (to develop cyan), a green sensitive emulsion layer (to develop magenta), and a blue sensitive emulsion layer (to develop yellow), whose respective spectral sensitivities are shown in FIG. 1 (reproduced from "Syasinkougaku no kiso-Ginen syasin-", compiled by the The Society of Photographic Science and Technology of Japan, issued Jan. 20, 1979 by Corona Co., Ltd). It should be noted that there is a region of the spectrum (from 560 nm to 660 nm) between the wavelengths to which the red-sensitive emulsion layer is sensitive and the wavelengths to which the green-sensitive emulsion layer is sensitive. In this region, the relative sensitivity is extremely low. This region, which is called "green-lack", is intentionally formed to improve working efficiency and to adjust colors to the human visual sense. It is in this region of the spectrum that the masking material of the present invention has a reduced opaqueness, so that it permits the transmission of the light in this region of the spectrum but shuts out the light in other regions of the spectrum to which color paper is highly sensitive.

Figure 2:
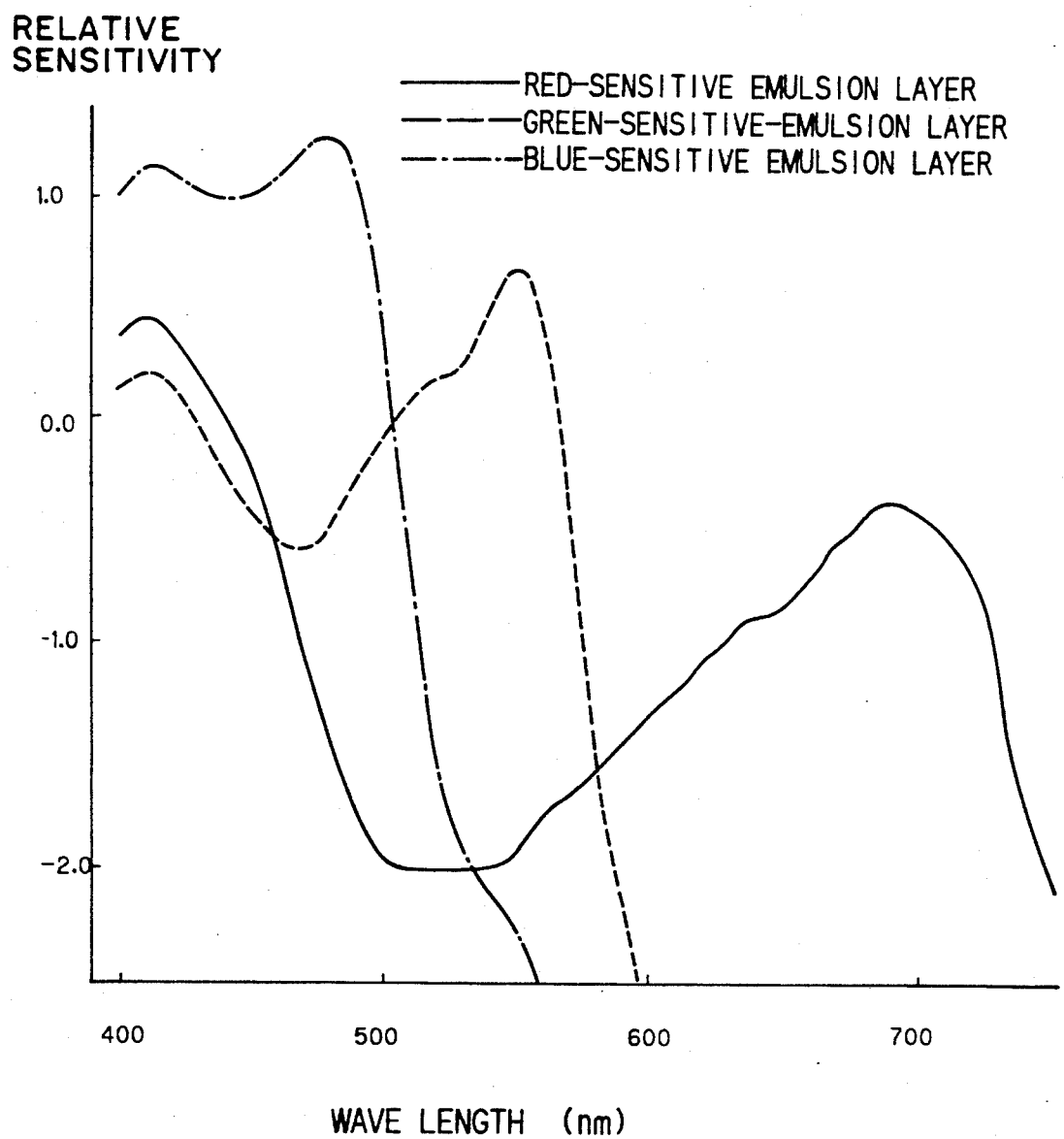
FIG. 2 is a graph showing the spectral relative sensitivity of commercial color paper.

The "green-lack" region is not always completely non-sensitive but has a certain degree of sensitivity, as demonstrated by FIG. 2 in which the relative sensitivity of commerical color paper is plotted against the wavelength. Therefore, the masking material of the present invention is not as transparent as ordinary masking film; but it has a reduced opaqueness so that it permits the transmission of the light in this region of the spectrum when it is used on a light table. The opaqueness should be high enough to give a transmission density greater than 2.0 (by Macbeth TD-904 green filter), although it varies depending on the sensitivity of color paper to the "green-lack" region of the spectrum. This opaqueness is necessary for the safety of operation, so that color paper does not fog even when it is exposed to ten times as much light as required.

The masking material of the present invention may take any form and structure so long as it has the basic functions of the ordinary masking material. For example, it may be a single-layered sheet or film made of a resin uniformly incorporated with a coloring agent, or it may be of multilayered structure formed by laminating a peelable opaque layer on a transparent support.

As mentioned above, the masking material of the present invention permits one to perform cutting, while watching the underlying original through it on a light table, because it has a reduced opaqueness for a region of the spectrum (called "green-lack") to which color paper is barely sensitive. In addition, it shuts out the light in other regions of the spectrum to which color paper is sensitive, so that it prevents color paper from fogging at the time of exposure and provides a good image.

EXAMPLES

The invention will be described in more detail with reference to the following examples, which are not intended to restrict the scope of the invention.

EXAMPLE 1

A homogeneous coating solution of the following composition was applied to a 100-μm thick polyetylene terephthalate film, followed by drying, to give a 25-μm thick peelable semi-opaque layer.

| Composition of the coating solution | |
|---|---|
| Vinyl chloride-vinyl acetate copolymer resin ("Vinylite VYHH", a product of Union Carbide Corporation) | 10.5 parts by weight |
| Acrylonitrile butadiene rubber ("Nipol 1432J", a product of Nippon Zeon Co., Ltd.) | 5.5 parts by weight |
| Methyl ethyl ketone | 41.2 parts by weight |
| Toluol | 41.2 parts by weight |
| Blue dye ("Vali Fast Blue 2606", a product of Orient Kagaku Kogyo Co., Ltd.) | 0.6 part by weight |
| Yellow dye ("Oil Yellow 101", a product of Orient Kagaku Kogyo Co., Ltd.) | 0.4 part by weight |
| Orange dye ("Spilon Orange 2RH", a product of Hodogaya Kagaku Kogyo Co., Ltd.) | 0.6 part by weight |

Figure 3:
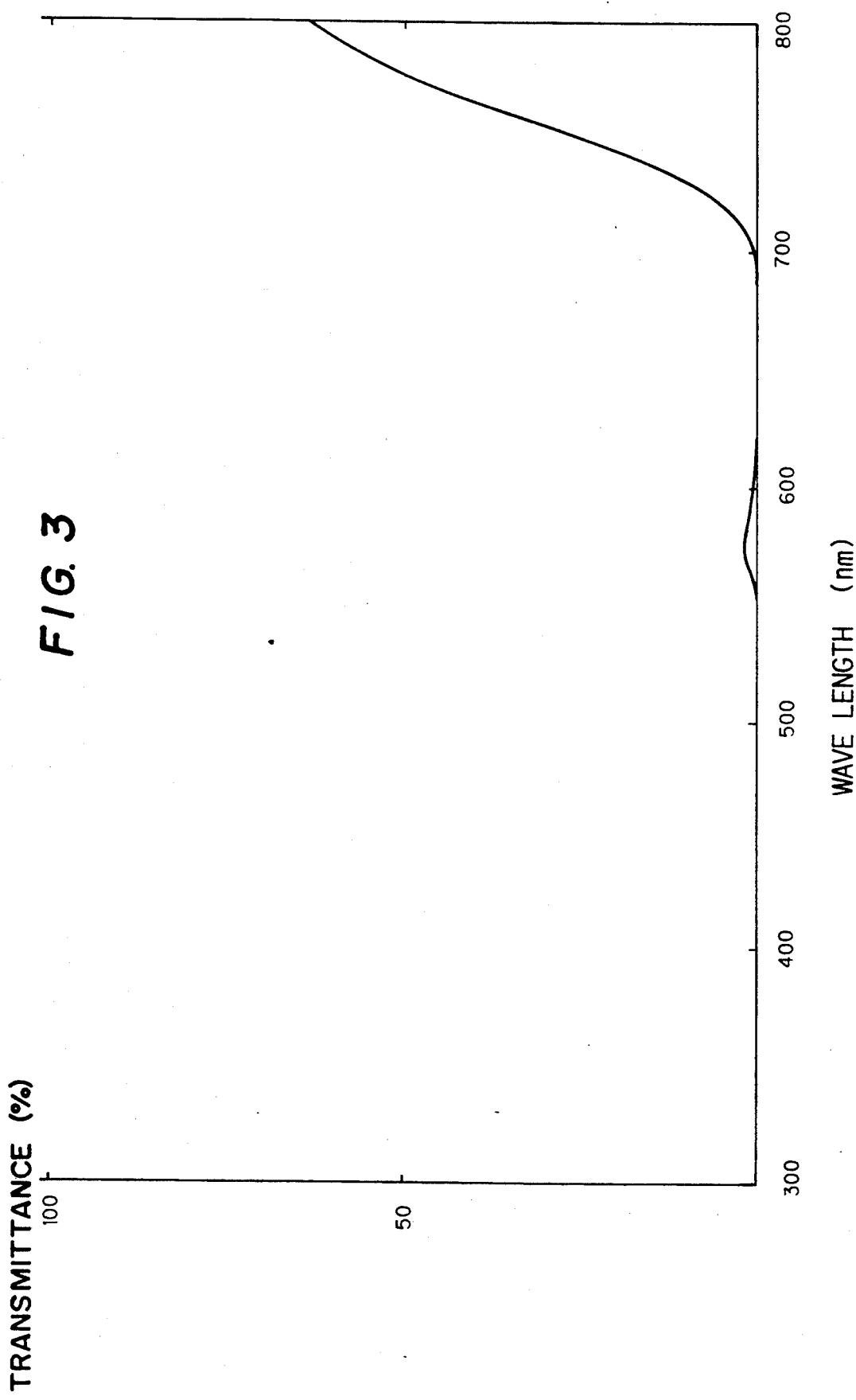

The thus obtained masking material gave a light transmission spectrum as shown in FIG. 3. In addition, this masking material has an opaqueness to give a transmission density of 2.42 (by Macbeth TD-904 green filter). With this masking material on, commercial color paper was exposed to ten times as much light as normally required. No fogging occurred at all in the masked part.

When the masking material was placed on an original for cutting work on a light table, it permitted one to easily watch the underlying original through it. In addition, the peelable semi-opaque layer could be cut exactly and peeled easily, without any residues remaining on the support.

EXAMPLE 2

A coating solution of the following composition was applied to a 100-μm thick polyethylene terephthalate film, followed by drying, to give a 2.0-μm thick adhesive layer.

| Composition of the coating solution | |
|---|---|
| Natural rubber | 5.0 parts by weight |
| Toluol | 95.0 parts by weight |

Then, a homogeneous coating solution of the following composition was applied on the adhesive layer, followed by drying, to give a 40-μm thick readhesive-peelable semi-opaque layer.

| Composition of the coating solution | |
|---|---|
| Nitrocellulose ("Nitrocellulose HIG-2", a product of Asahi Kasei Kogyo Co., Ltd.) | 14.9 parts by weight |
| Castor oil | 9.9 parts by weight |
| Methl ethyl ketone | 37.2 parts by weight |
| Toluol | 37.2 parts by weight |
| Blue dye ("Vali Fast Blue 2606", a product of Orient Kagaku Kogyo C., Ltd.) | 0.3 part by weight |
| Yellow dye ("Oil Yellow 101", a product of Orient Kagaku Kogyo Co., Ltd.) | 0.2 part by weight |
| Red dye ("Neozapon Red 335", a product of BASF) | 0.1 part by weight |
| Orange dye ("Neozapon Orange 251", a product of BASF) | 0.2 part by weight |

The thus obtained masking material gave a light transmission spectrum as shown in FIG. 4. In addition, this masking material has an opaqueness to give a transmission density of 2.33 (by Macbeth TD-904 green filter). With this masking material on, the same commercial color paper as used in Example 1 was exposed to ten times as much light as normally required. No fogging occurred at all in the masked part.

When the masking material was placed on an original for cutting work on a light table, it permitted one to easily watch the underlying original through it. In addition, the readhesive and peelable semi-opaque layer could be cut exactly and peeled easily, without any residues remaining on the support.

EXAMPLE 3

An emulsion of vinylidene chloride (*1) was applied on a 50-μm thick flexible vinyl chloride film, followed by drying, to give a 2-μm thick undercoat layer for adhesion.

1 "Kureharon Latex DO", a product of Kureha Kagaku Kogyo Co., Ltd.

Then, a homogeneous coating solution of the following composition was applied on the undercoat layer, followed by drying, to give a 10-μm thick opaque layer. (The resulting laminate is a so-called vinyl sheet.)

| Composition of the coating solution | |
|---|---|
| Copolymer polyester resin ("Bilon 200", a product of Toyo Boseki Co., Ltd.) | 12.2 parts by weight |
| Vinylidene chloride-acrylonitrile copolymer ("Saran Resin R-202", a product of Asahi Kasei Kogyo Co., Ltd.) | 5.0 parts by weight |
| Methyl ethyl ketone | 40.5 parts by weight |
| Toluol | 40.5 parts by weight |
| Blue dye ("Vali Fast Blue 2606", a product of Orient Kagaku Kogyo Co., Ltd.) | 0.6 part by weight |
| Yellow dye ("Oil Yellow 101", a product of Orient Kagaku Kogyo Co., Ltd.) | 0.2 part by weight |
| Orange dye ("Spilon Orange 2RH", a product of Hodogaya Kagaku Kogyo Co., Ltd.) | 0.6 part by weight |

The thus obtained masking material gave a light transmission spectrum as shown in FIG. 5. In addition, this masking material has an opaqueness to give a transmission density of 2.51 (by Macbeth TD-904 green filter). With this masking material on, the same commercial color paper as used in Example 1 was exposed to ten times as much light as normally required. No fogging occurred at all in the masked part.

When the masking material was placed on a section film for cutting work on a light table, it permitted one to easily watch the underlying section film through it. In addition, this masking material could be cut exactly and easily.

EFFECT OF THE INVENTION

As demonstrated in the above-mentioned examples, the masking material of the present invention permits one to watch clearly the underlying any patterns through it for cutting on a light table and yet shuts out light to which color paper is sensitive. Therefore, it facilitates the proofing work for the photomechanical process and provides a good image without fog.

What is claimed is:

1. A masking material for masking a photosensitive color element having three light-sensitive layers for developing cyan, magenta and yellow, respectively, said masking material comprising a layer containing a colorant and blocking transmission of light in those areas of the visible spectrum to which said photosensitive color element is sensitive, while transmitting light within the range of 560–660 nm with a transmission density sufficiently high to avoid fogging of the color element.

2. The masking material of claim 1 wherein said colorant comprises an admixture of blue and orange dyes.

3. The masking material of claim 2 wherein said admixture additionally comprises a yellow dye.

4. The masking material of claim 2 having a transmission density of greater than 2.0.

* * * * *